US006162725A

United States Patent [19]

Tanaka

[11] Patent Number: 6,162,725

[45] Date of Patent: Dec. 19, 2000

[54] PROCESS OF PATTERNING CONDUCTIVE LAYER INTO ELECTRODE THROUGH LIFT-OFF USING PHOTO-RESIST MASK IMPERFECTLY COVERED WITH THE CONDUCTIVE LAYER

[75] Inventor: Yoshito Tanaka, Tokyo, Japan

[73] Assignee: NEC Corporation, Tokyo, Japan

[21] Appl. No.: 08/933,077

[22] Filed: Sep. 18, 1997

[30] Foreign Application Priority Data

Sep. 20, 1996 [JP] Japan .................................... 8-249528

[51] Int. Cl.[7] ...................................................... H01L 21/44

[52] U.S. Cl. .......................... 438/670; 438/665; 438/951; 438/609

[58] Field of Search ..................................... 438/665, 670, 438/951, 964, 609, FOR 347, FOR 455, FOR 488, 587

[56] References Cited

U.S. PATENT DOCUMENTS 4,642,163 2/1987 Greschner et al. ....................... 216/13

FOREIGN PATENT DOCUMENTS 669644 3/1899 Japan .
63-160394 7/1988 Japan .
64-9727 2/1989 Japan .
3280542 11/1991 Japan .

*Primary Examiner*—Olik Chaudhuri
*Assistant Examiner*—Ginette Peralta
*Attorney, Agent, or Firm*—Sughrue, Mion, Zinn, Macpeak & Seas, PLLC

[57] ABSTRACT

Transparent electrodes of a plasma display panel is patterned from a transparent conductive layer by using a lift-off technique; a photo-resist mask is roughened through exposure to oxygen plasma before the deposition of the transparent conductive layer, and the rough surface causes the photo-resist mask to be partially uncovered with the transparent conductive layer, thereby allowing photo-resist remover to rapidly penetrate into the boundary between the photo-resist mask and a glass substrate.

11 Claims, 10 Drawing Sheets

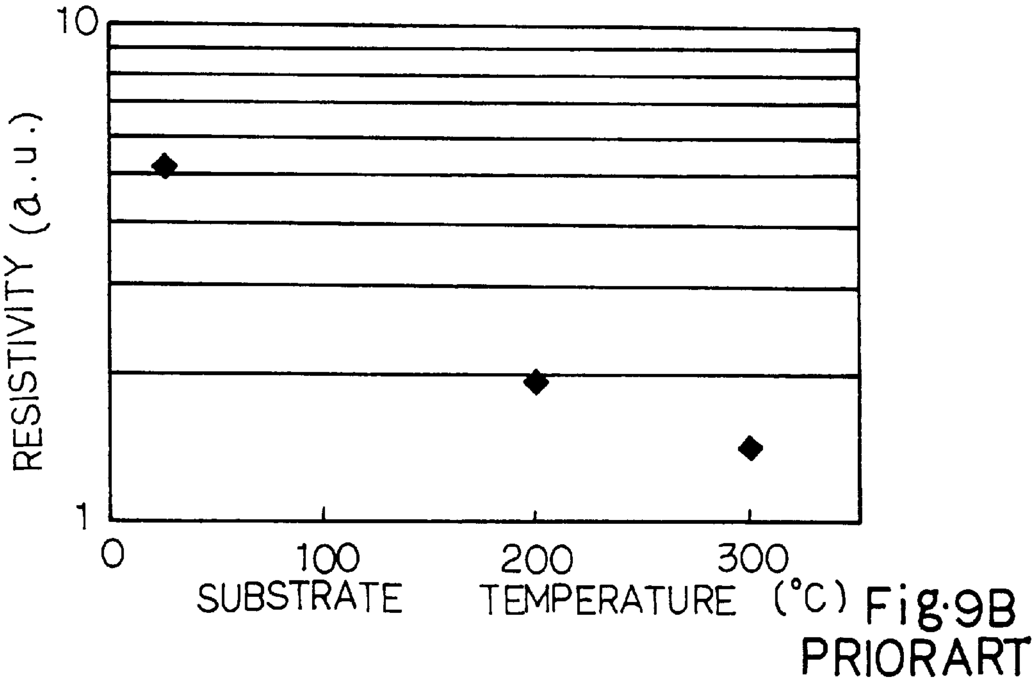
Fig.9B
PRIORART

PROCESS OF PATTERNING CONDUCTIVE LAYER INTO ELECTRODE THROUGH LIFT-OFF USING PHOTO-RESIST MASK IMPERFECTLY COVERED WITH THE CONDUCTIVE LAYER

FIELD OF THE INVENTION

This invention relates to a process of fabricating a plasma display and, more particularly, to a process of patterning a conductive layer into an electrode on a transparent substrate of a plasma display.

DESCRIPTION OF THE RELATED ART

The plasma display is categorized in a panel display, and an ac-current driven plasma display panel is proposed. One of the fundamental requirements of the ac-current driven plasma display panel is to increase the ratio of an image forming area to a front area of the plasma display panel. A transparent electrode is matched with the fundamental requirement, and is used as the electrode on the front side.

A typical example of the transparent material available for the transparent electrode is indium tin oxide, and an indium tin oxide electrode is patterned by using lithography and an etching.

FIGS. 1A to 1D illustrates the prior art process sequence. First, indium tin oxide is deposited over the entire surface of a glass substrate 1, and the glass substrate 1 is overlain by an indium tin oxide layer 2 as shown in FIG. 1A. Photo-resist is spread over the indium tin oxide layer 2, and an image of a transparent electrode is optically transferred from a photo-mask (not shown) to the photo-resist layer. The latent image is developed, and the photo-resist layer is formed into a photo-resist mask 3 on the indium tin oxide layer 2 as shown in FIG. 1B. Using the photo-resist mask 3, the indium tin oxide layer 2 is selectively etched away, and the indium tin oxide layer 2 is formed into a transparent electrode 2*a* as shown in FIG. 1C. The photo-resist mask 3 is stripped off, and the transparent electrode 2*a* is left on the glass substrate 1 as shown in FIG. 1D.

Another patterning technology is called as "lift-off", and FIGS. 2A to 2C illustrate the prior art lift-off process. Photo-resist is spread over the entire surface of a glass substrate 5, and the glass substrate 1 is overlain by a photo-resist layer. An image of a transparent electrode is transferred from a photo-mask (not shown) to the photo-resist layer, and the latent image is developed. As a result, a photo-resist mask 6 is left on the glass substrate 5 as shown in FIG. 2A. Subsequently, indium tin oxide is deposited over the entire surface of the resultant structure, i.e., the photo-resist mask 6 and an exposed area of the glass substrate 5, and an indium tin oxide layer 7 topographically extends over the exposed area of the glass substrate 5 and the photo-resist mask 6 as shown in FIG. 2B. The photo-resist mask 6 is peeled off together with the indium tin oxide deposited thereon, and a transparent electrode 7*a* is left on the glass substrate 5 as shown in FIG. 2C.

A screen printing technology is further known to a person skilled in the art for patterning a conductive layer into an electrode. However, the screen printing technology is not available for a miniature pattern of a plasma display panel.

The transparent electrodes 2*a*/7*a* thus patterned are expected to be strongly adhered to the glass substrate 1/5. If the transparent electrode 2*a*/7*a* is peeled from the glass substrate 1/5, and a part of image is not produced on the screen.

It is known that a plasma treatment enhances the adhesion between different material layers. Japanese Patent Publication of Unexamined Application No. 6-69644 discloses a surface treatment for improving adhesion between a high-molecular material layer and a metal layer. The contact surface of the high-molecular material layer is exposed to plasma so as to create a rough contact surface. However, reaction product takes place through the plasma treatment, and the reaction product is removed into solvent. Thereafter, metal is deposited on the contact surface.

Japanese Patent Publication of Unexamined Application No. 63-160394 proposes to deposit a conductive pattern by using a plasma-beam deposition technique following by a lift-off technique. The Japanese Patent Publication of Unexamined Application recommends a manufacturer to expose a surface of a substrate to an rf plasma or glow-discharge in order to improve the adhesion between the substrate and a deposited layer.

Japanese Patent Publication of Examined Application No. 64-9727 discloses a vacuum evaporation system for a lift-off technique. The vacuum evaporation system exposes residual photo-resist to oxygen gas plasma in order to ash the residual photo-resist. After the removal of the residual photo-resist, evaporated material is deposited, and the adhesion is improved.

FIGS. 3A to 3C illustrate a prior art process using the prior art vacuum evaporation system. Photo-resist is spread over a glass substrate 10, and the glass substrate 10 is overlain by a photo-resist layer. An image pattern is optically transferred from a photo-mask (not shown) to the photo-resist layer so as to form a latent image therein. The latent image is developed, and a photo-resist mask 11*a* is left on the glass substrate 10 together with residual pieces 11*b*/11*c* of photo-resist as shown in FIG. 3A. The residual pieces of photo-resist weaken the adhesion between the glass substrate 10 and a layer deposited thereover.

Subsequently, the glass substrate 10 is placed in the vacuum chamber of the vacuum evaporation system (not shown) disclosed in Japanese Patent Publication of Unexamined Application No. 64-9727, and the vacuum evaporation system creates oxygen plasma 12 in the vacuum chamber. The photo-resist mask 11*a* and the residual pieces 11*b*/11*c* of photo-resist are exposed to the oxygen plasma 12, and the oxygen plasma 12 ashes the residual pieces 11*b*/11*c* of photo-resist as shown in FIG. 3B. Thus, the exposed surface of the glass substrate 10 is cleaned through the exposure to the oxygen plasma.

Conductive material is deposited over the entire surface of the resultant structure shown in FIG. 3B, and a conductive layer topographically extends over the exposed area of the glass substrate 10 and the photo-resist mask 11*a*.

The photo-resist mask 11*a* is removed from the glass substrate 10 together with the conductive material, and a metal pattern 13 is left on the glass substrate 10 as shown in FIG. 3C. Thus, the oxygen-plasma ashing is combined with the lift-off process, and the metal pattern 13 is formed on the clean surface of the glass substrate 10.

The prior art process shown in FIGS. 1A to 1D encounters a problem in complexity. The prior art process shown in FIGS. 1A to 1D requires an etching for the indium tin oxide layer 2 after the lithography, and the process sequence is more complex than the lift-off process.

The prior art lift-off process shown in FIGS. 2A to 2C and the modified lift-off process shown in FIGS. 3A to 3C do not contain an etching, and are rather simple. However, the peeling-off step consumes long time. This is because of the fact that the conductive layer 7 perfectly covers the photo-resist mask 6. The conductive layer 7 blocks the photo-resist mask 6 from photo-resist remover, and the photo-resist remover penetrates through the boundary between the conductive layer 7 and the glass substrate 5 and pin holes unintentionally produced in the conductive layer 7. For this reason, the conductive layer 7 prolongs the peeling-off time more than ten limes longer than time consumed in the removal of the photo-resist without a conductive layer. This results in high production cost.

SUMMARY OF THE INVENTION

It is therefore an important object of the present invention to provide a process of fabricating a plasma display which contains an electrode patterned through a lift-off completed within short time period.

To accomplish the object, the present invention proposes to intentionally imperfectly cover a photo-resist mask with a conductive layer.

In accordance with one aspect of the present invention, there is provided a process of patterning a conductive layer into an electrode, comprising the steps of preparing a substrate having a major surface, forming a mask on an area of the major surface of the substrate, roughening a surface of the mask, depositing a conductive layer on the surface of the mask and a remaining area of the major surface of the substrate so as to partially uncover the mask with the conductive layer, and removing the mask covered with a part of the conductive layer from the substrate so as to leave an electrode on the remaining area of the major surface of the substrate.

BRIEF DESCRIPTION OF THE DRAWINGS

The features and advantages of the process will be more clearly understood from the following description taken in conjunction with the accompanying drawings in which:

FIGS. 9A and 9B are graphs showing relations between resistivity of deposited materials and substrate temperature.

DESCRIPTION OF THE PREFERRED EMBODIMENT

Structure of Plasma Display Panel

Figure 1A:
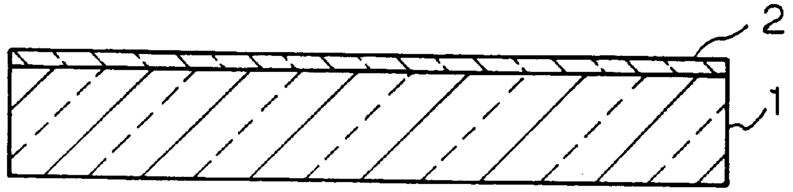
Fig. 1A PRIOR ART
FIGS. 1A to 1D are cross sectional views showing the prior art process using the lithography and the etching.
Figure 1B:
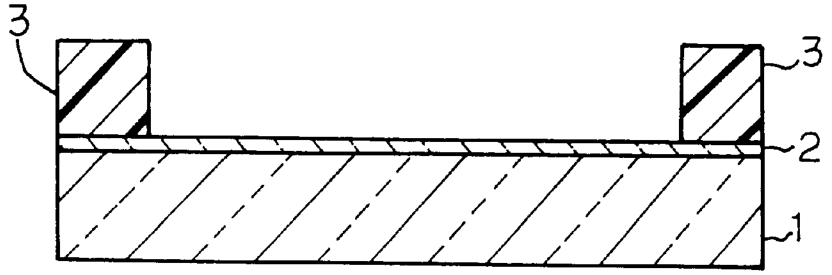
Fig. 1B PRIOR ART
Figure 1C:
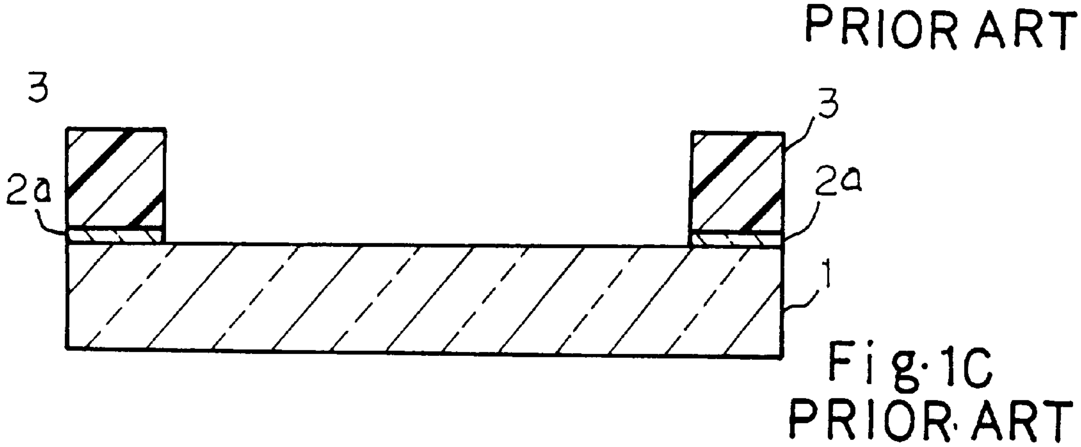
Fig. 1C PRIOR ART
Figure 1D:
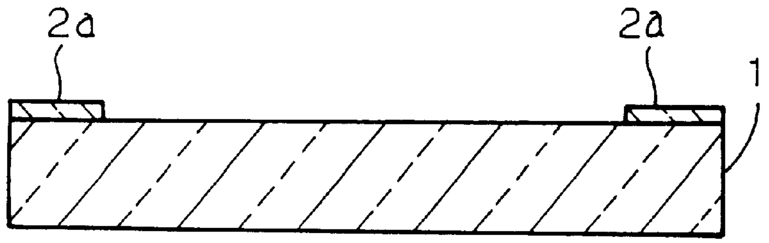
Fig. 1D PRIOR ART
Figure 2A:
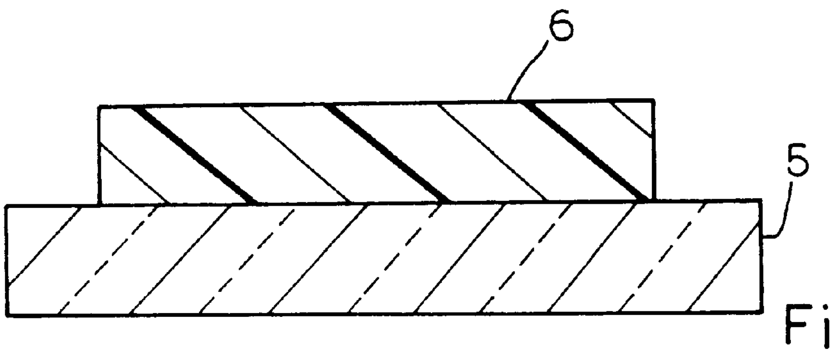
Fig. 2A PRIOR ART
FIGS. 2A to 2C are cross sectional views showing the prior art lift-off process.
Figure 2B:
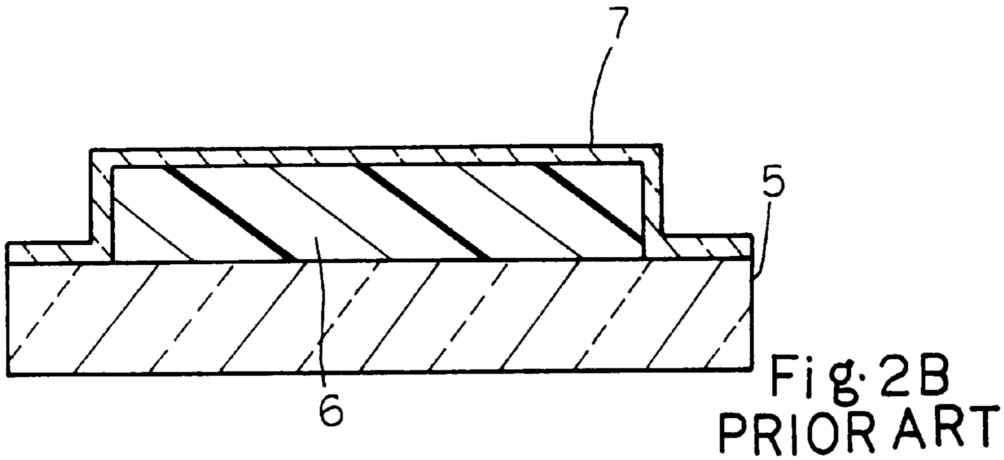
Fig. 2B PRIOR ART
Figure 2C:
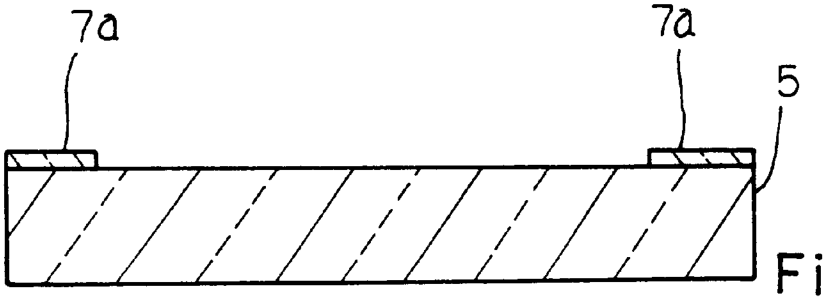
Fig. 2C PRIOR ART
Figure 3A:
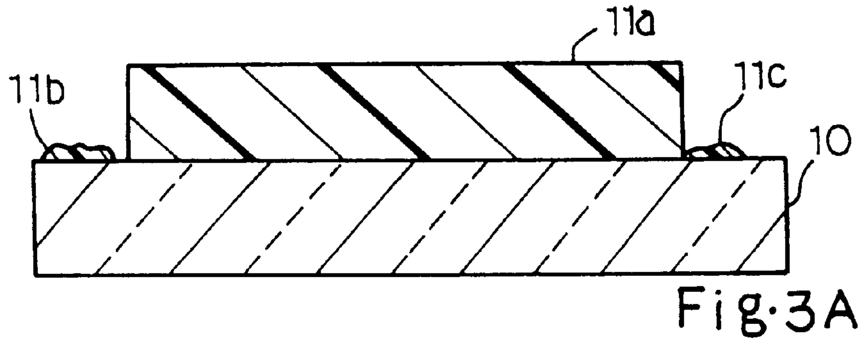
Fig·3A PRIOR ART
FIGS. 3A to 3C are cross sectional views showing the prior art process using the vacuum evaporation system disclosed in Japanese Patent Publication of Examined Application No. 64-9727.
Figure 3B:
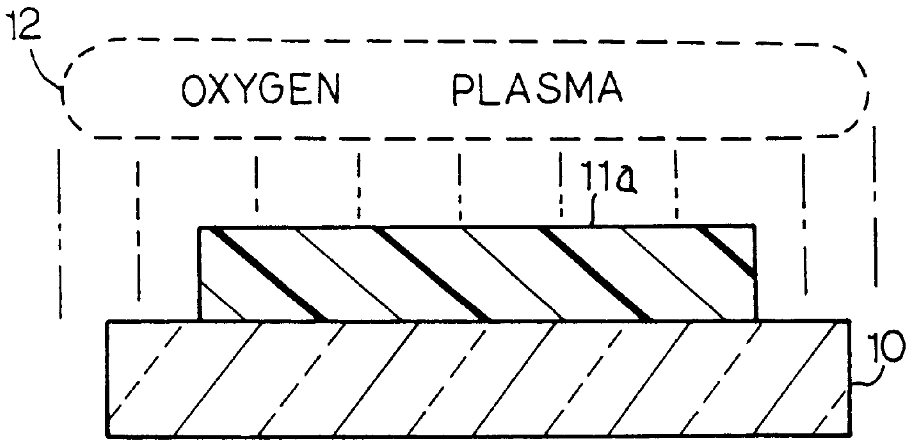
Fig·3B PRIOR ART
Figure 3C:
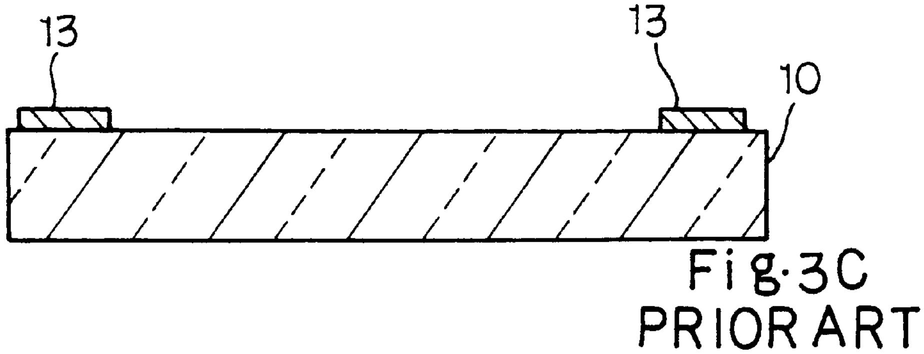
Fig·3C PRIOR ART
Figure 4:
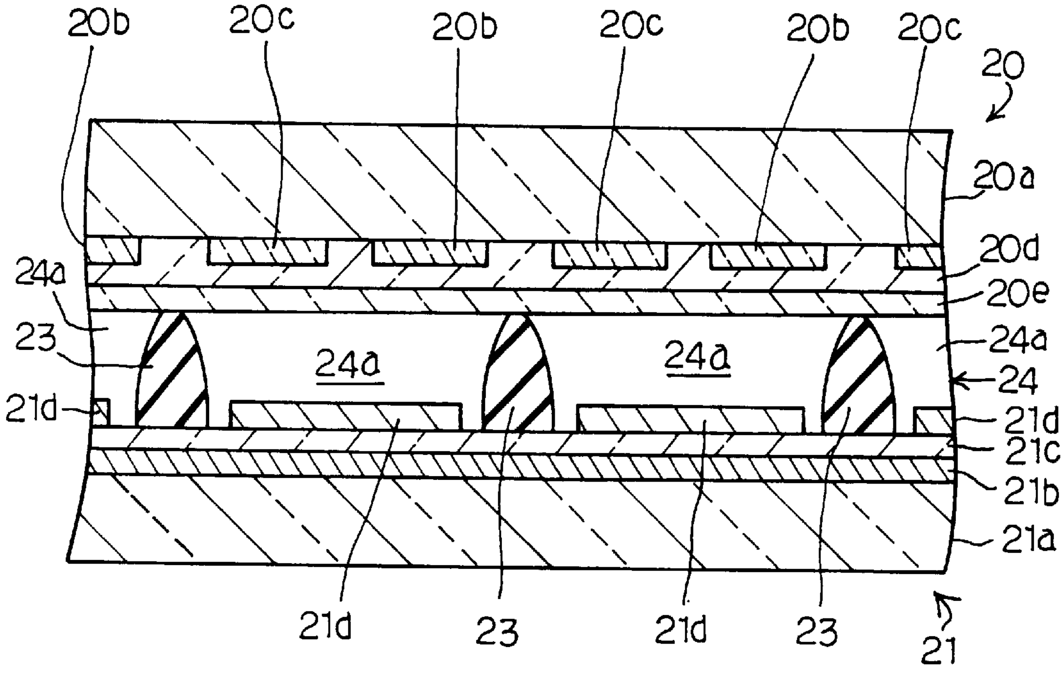
FIG. 4 is a schematic cross sectional view showing the structure of an ac current driven plasma display panel according to the present invention.

Referring to FIG. 4 of the drawings, an ac-current driven plasma display panel embodying the present invention largely comprises a first substrate structure 20, a second substrate structure 21 and partition walls 23. The first substrate structure 20 is provided in parallel to and spaced apart from the second substrate structure 21, and inner space 24 takes place between the first substrate structure 20 and the second substrate structure 21. The partition walls 23 divide the inner space 24 into a plurality of light-emitting domains 24*a*, and Penning gas is sealed in the inner space 24. In this instance, the Penning gas contains helium and xenon.

The first substrate structure includes a glass substrate 20*a*, pairs of transparent electrodes 20*b*/20*c*, a dielectric layer 20*d* and a protective layer 20*e*. The transparent electrodes 20*b* and 20*c* are patterned in parallel on the inner surface of the glass substrate 20*a*, and are alternated with each other. The pairs of transparent electrodes 20*b*/20*c* are covered with the dielectric layer 20*d* for ac-current driving, and the dielectric layer 20*d* is overlain by the protective layer 20*e*. The protective layer 20*e* prevents the dielectric layer 20*d* from ion bombardment.

The dielectric layer 20*d* is formed as follows. Low-fusing point glass paste is screen printed on the transparent electrodes 20*b*/20*c*, and is sintered so as to cover the transparent electrodes 20*b*/20*c* with the dielectric layer 20*d*.

The second substrate structure 21 includes a glass substrate 21*a*, data electrodes 21*b*, a dielectric layer 21*c* and fluorescent layers 21*d*. The data electrodes 21*b* are patterned on the inner surface of the glass substrate 21*a*, and are covered with the dielectric layer 21*c*. The dielectric layer 21*c* is formed in the similar manner to the dielectric layer 20*d*. The fluorescent layers 21*d* are patterned on the dielectric layer 21*c*, and are exposed to the light-emitting domains 24*a*. When the fluorescent layers 21*d* are selectively radiated with ultra-violet light, the fluorescent layers 21*d* are excited, and emit light in predetermined color.

The ac-current driven plasma display panel produces an image as follows. An alternating pulse signal is applied to the transparent electrodes 20*b* and 20*c*, and a potential difference is alternated between the transparent electrodes 20*b* and 20*c*. Discharging takes place on the surface of the dielectric layer 20*d* at every alternation of potential level, and ultra-violet light is selectively radiated toward the fluorescent layers 21*d*. Tile fluorescent layers 21*d* are excited with the ultra-violet light, and emit light toward the first substrate structure 20. The emitted light passes through the transparent electrodes 20*b*/20*c* and the glass substrate 20*a*, and produces an image.

Process Sequence

Figure 5A:
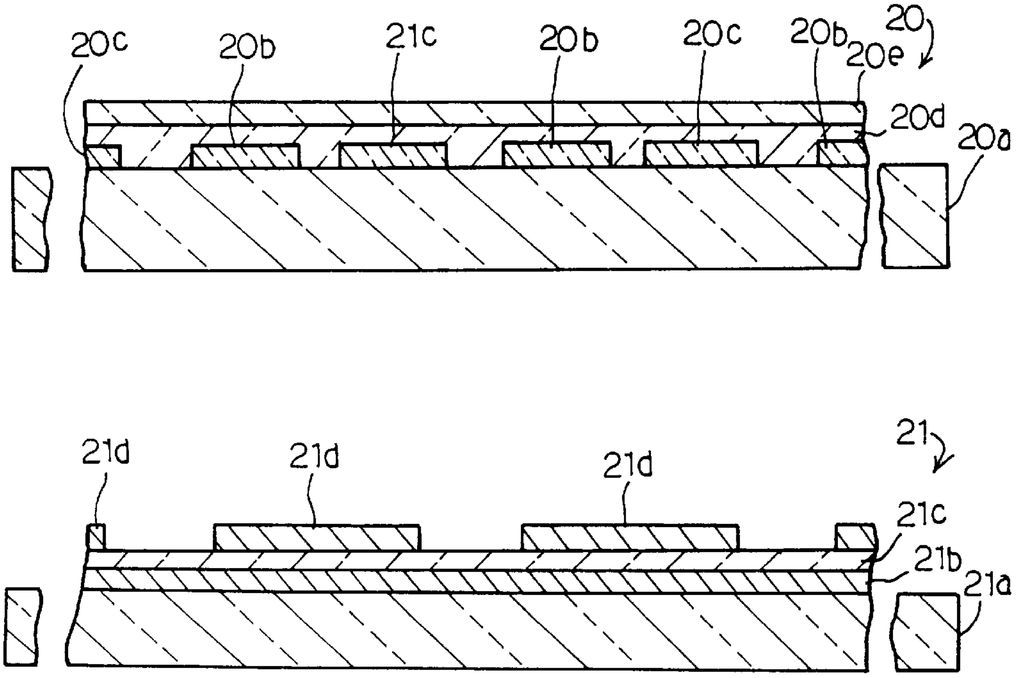
FIGS. 5A to 5C are cross sectional views showing a process of fabricating an ac-current driven plasma display panel.
Figure 5B:
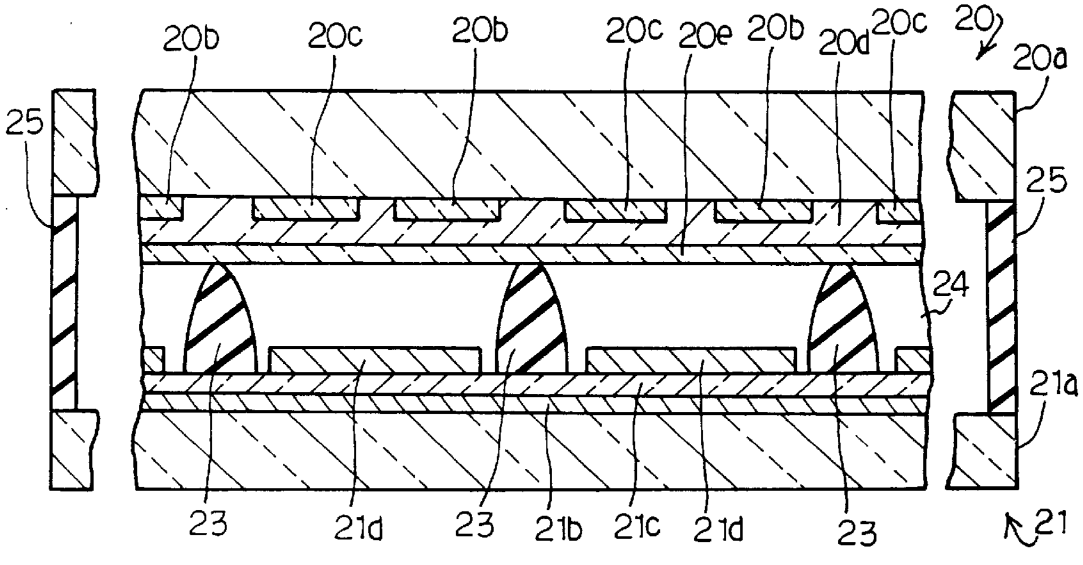
Figure 5C:
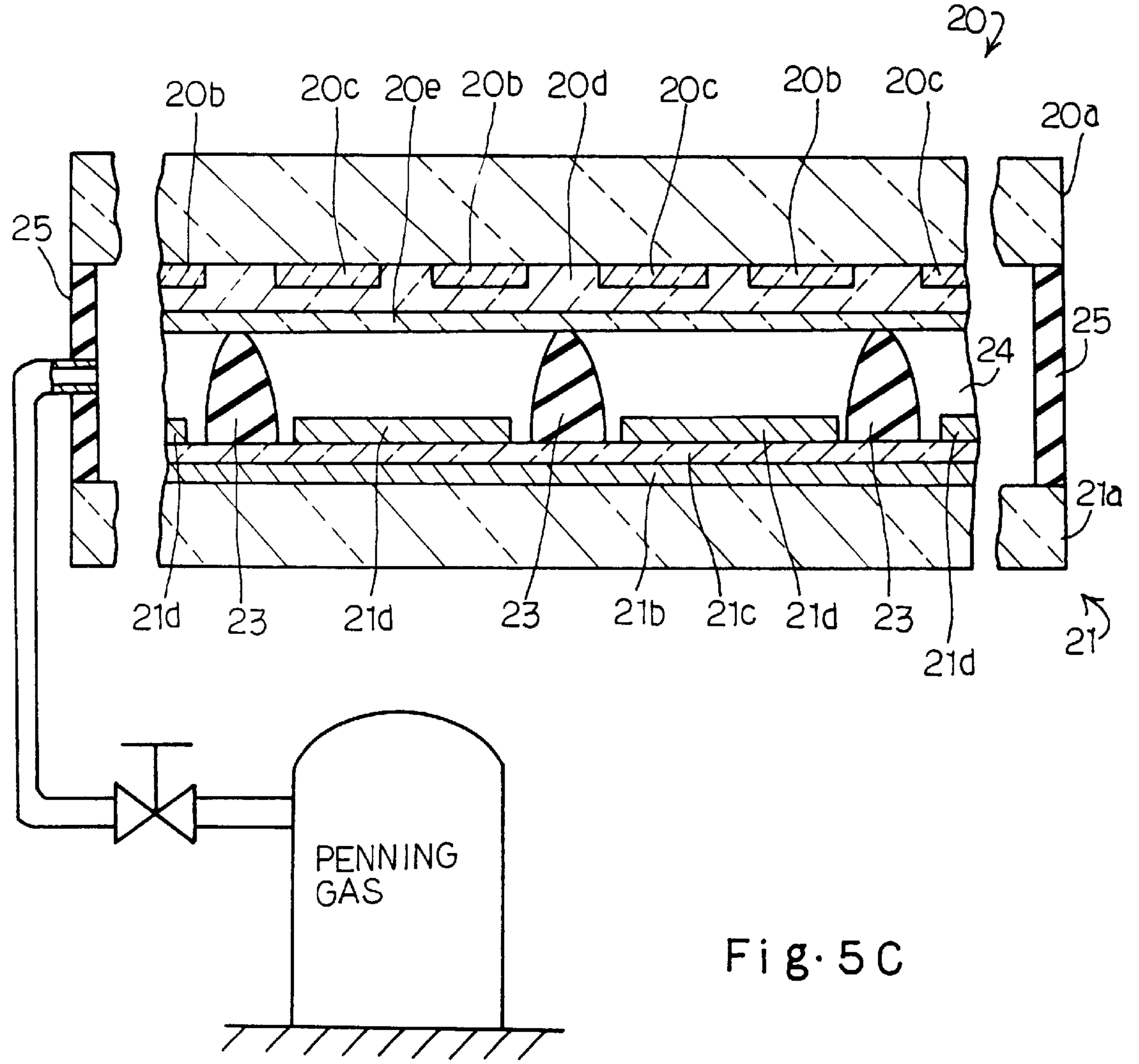

First, description is made on a process of fabricating the ac-current driven plasma display panel with reference to FIGS. 5A to 5C. The process starts with preparation of the first substrate structure 20 and the second substrate structure 21 as shown in FIG. 5A.

The transparent electrodes 20*b*/20*c* are patterned on the glass substrate 20*a* as described hereinafter in detail. Low-fusing point glass paste is screen printed over the transparent electrodes 20*b*/20*c*, and is, thereafter, sintered. Then, the transparent electrodes 20*b*/20*c* are covered with the dielectric layer 20*d*. The dielectric layer 20*d* is overlain by the protective layer 20*e*, and the first substrate structure 20 is completed. The second substrate structure 21 is fabricated as similar to the first substrate structure 20.

Subsequently, the protective layer 20*e* is opposed to the fluorescent layers 21*d*, and a spacer 25 and the partition walls 23 are provided between the first substrate structure 20 and the second substrate structure 21. The first and second substrate structures 20 and 21 are adhered to the spacer 25, and the inner space 24 takes place between the first substrate structure 20 and the second substrate structure 21 as shown in FIG. 5B.

Finally, Penning gas is introduced into the inner space 24 as shown in FIG. 5C, and is sealed into the inner space 24.

Figure 6A:
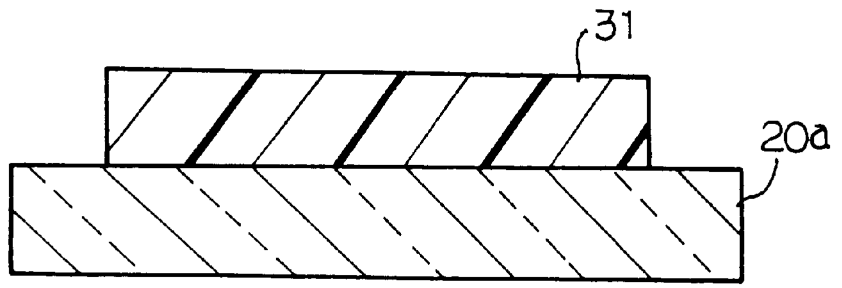
FIGS. 6A to 6D are cross sectional views showing a process sequence for patterning a conductive layer into an electrode according to the present invention.

The patterning stage of the transparent electrodes 20*b*/20*c* is detailed with reference to FIGS. 6A to 6D. First, the glass substrate 20*a* is prepared, and a dry film of photo-resist is adhered to the major surface of the glass substrate 20*a*. The dry film of photo-resist is of the order of 15 microns thick. An image for the transparent electrodes 20*b*/20*c* is optically transferred from a photo-mask (not shown) to the dry film of photo-resist, and a latent image is produced in the dry film. The latent image is developed, and a photo-resist mask 31 is left on the major surface of the glass substrate 20*a* as shown in FIG. 6A.

Figure 7:
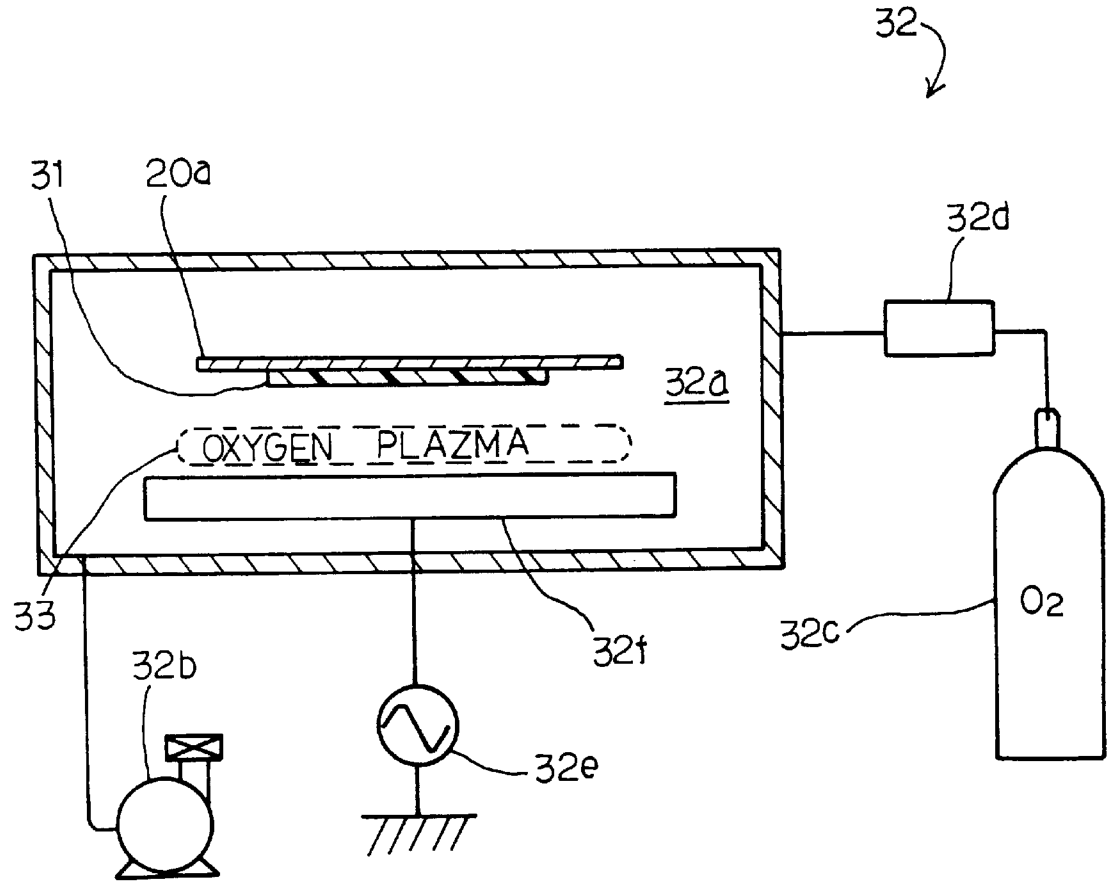
FIG. 7 is a schematic view showing a plasma processing system used in the process.

The glass substrate 20*a* is placed in a vacuum chamber 32*a* of a plasma processing system 32 (see FIG. 7), and a vacuum pump 32*b* evacuates the air from the vacuum chamber 32*a*. Oxygen gas is introduced from a gas source 32*c* through a mass flow controller 32*d* into the vacuum chamber 32*a*. The mass flow controller 32*d* and the vacuum pump 32*b* regulate the partial pressure of oxygen to 50 milli-torr, and an electric power source 32*e* applies electric power at 13.56 MHz to a plasma electrode 32*f*. Then, oxygen plasma 33 is created in the vacuum chamber 32*a*.

Figure 6B:
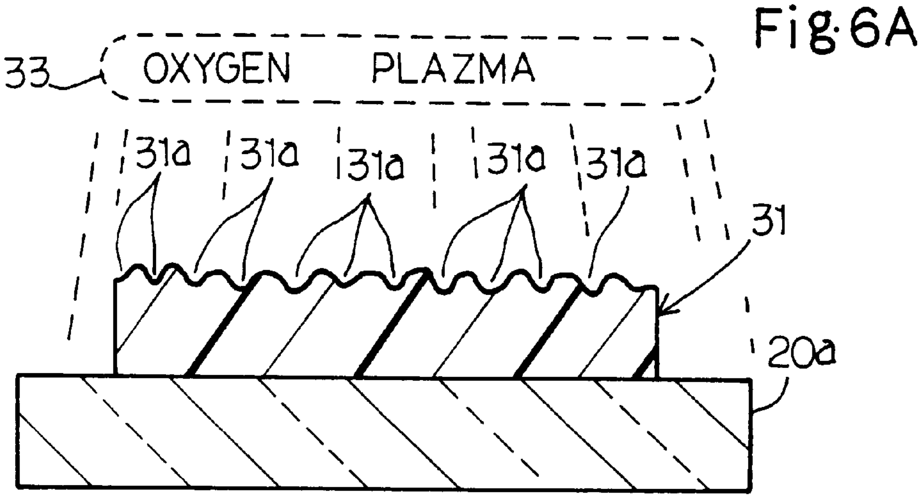

The photo-resist mask 31 is exposed to the oxygen plasma 33. The oxygen plasma 33 roughens the surface portion of the photo-resist mask 31, and micro-recesses 31*a* are formed in the surface portion of the photo-resist mask 31 as shown in FIG. 6B.

The high-frequency electric power is removed from the plasma electrode 32*f*, and the oxygen plasma 33 is extinguished. The vacuum pump 32*b* stops the evacuation, and the gas source 32*c* blocks the gas supply. The vacuum chamber 32*a* is recovered to the atmospheric pressure, and the glass substrate 20*a* is taken out from the vacuum chamber 32*a*.

Figure 8:
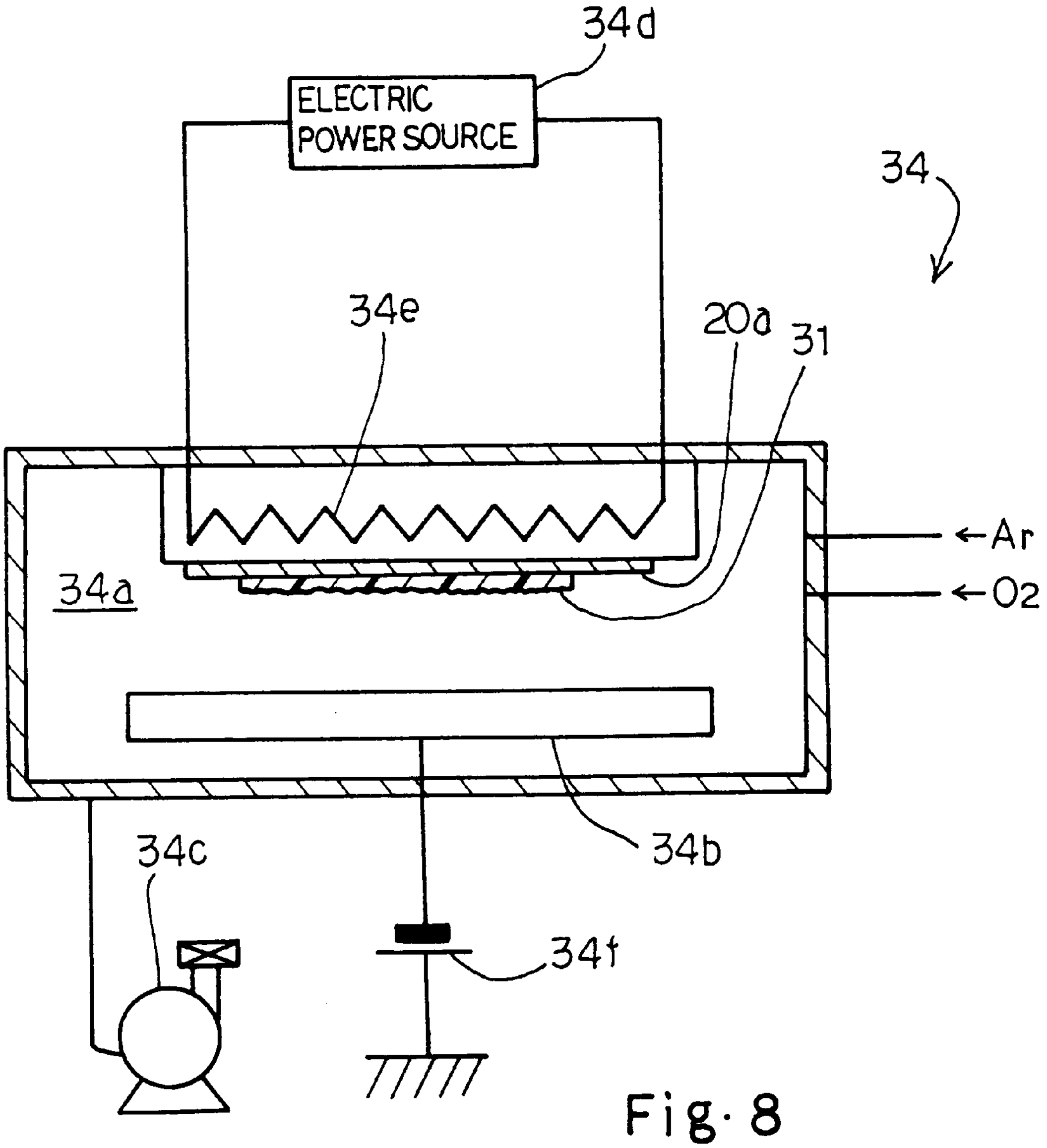
FIG. 8 is a schematic view showing a sputtering system used in the process.

Subsequently, the glass substrate 20*a* is placed into a vacuum chamber 34*a* of a dc diode sputtering system 34 (see FIG. 8). A sintered composite target 34*b* is opposed to the photo-resist mask 31 on the glass substrate 20*a*. The composite target 34*b* is sintered from tin oxide expressed as $SnO_2$ and antimony oxide expressed as $Sb_2O_3$. A vacuum pump 34*c* evacuates the vacuum chamber 34*a*, and maintains the vacuum chamber 34*a* at $1\times10^{-6}$ torr. An electric power source supplies electric power to a heater 34*e*, and the glass substrate 20*a* is heated to 150 degrees in centigrade so as to release absorbed gas from the glass substrate 20*a* and the photo-resist mask 31. Gaseous mixture of argon and oxygen is introduced into the vacuum chamber 34*a*, and the source of argon/oxygen and the vacuum pump 34*c* regulate the vacuum chamber 34*a* to 5 milli-torr. The partial pressure of oxygen is regulated to 5 percent.

Figure 6C:
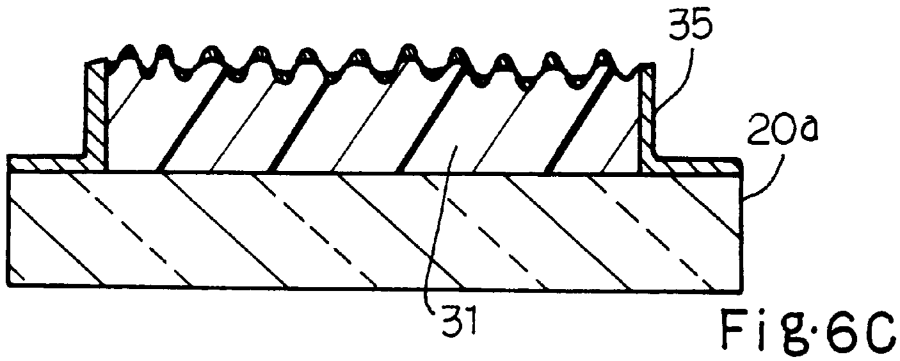

When the pressure in the vacuum chamber becomes stable, a dc power source 34*f* negatively biases the composite target 34*b*, and the composite target 34*b* is sputtered. Then, the transparent conductive material is deposited over the entire surface of the photo-resist mask 31 and the exposed area of the glass substrate 20*a* as shown in FIG. 6C. When the transparent conductive layer 35 reaches a target thickness such as 2000 angstroms, the sputtering is terminated. After recovery to the atmospheric pressure, the glass substrate 20*a* is taken out from the vacuum chamber 34*a*. The target thickness is less than a depth of the micro-recesses 31*a*. If the target thickness is 1000 angstroms, it is desirable for the micro-recesses 31*a* to have the depth equal to or greater than 5000 angstroms. Thus, the depth of the micro-recesses 31*a* is at least five times greater than the thickness of the transparent conductive layer 35. The micro-recesses 31*a* may be repeated at 500 angstroms to 2000 angstroms. The depth and the repetition are controllable by changing the intensity of the plasma, the partial pressure of oxygen and the exposure time.

Although the sputtering achieves a good step coverage rather than other deposition technologies, the surface of the photo-resist mask 31 is not perfectly covered with the transparent conductive layer 35, because the thickness is less than the depth of the micro-recesses 31*a*. In other words, the photo-resist mask 13 is partially uncovered with the transparent conductive layer 35.

Figure 6D:
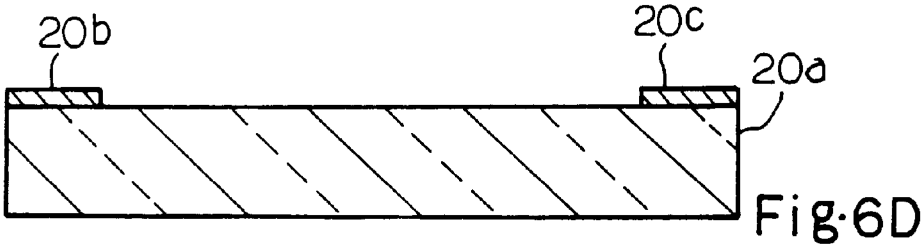

Subsequently, the resultant structure shown in FIG. 6C is dipped in wet etchant. The wet etchant is water solution of sodium hydroxide, and contains NaOH at 5 percent. The wet etchant penetrates through the exposed area of the photo-resist mask 31, and removes the photo-resist mask 31 together with a part of the transparent conductive layer 35 from the glass substrate 20*a*. The wet etching is completed as short as a wet etching on a photo-resist mask uncovered with any conductive layer, and the transparent electrodes 20*b*/20*c* are left on the major surface of the glass substrate 20*a* as shown in FIG. 6D.

The data electrodes 21*b* are formed as similar to the transparent electrodes. The glass substrate 21*a* is firstly prepared, and a dry film of photo-resist is adhered to the major surface of the glass substrate 21*a*. The dry film (not shown) of photo-resist is of the order of 15 microns thick. A pattern image for the data electrodes 21*b* is transferred from a photo-mask (not shown) to the dry film of photo-resist, and a latent image is produced in the dry film of photo-resist. The latent image is developed, and a photo-resist mask (not shown) is formed on the glass substrate 21*a*.

The photo-resist mask is exposed to the oxygen plasma so as to roughen the surface of the photo-resist mask. Micro-recesses are formed in the surface portion of the photo-resist mask. The resultant structure is placed in a vacuum chamber of an electron-beam evaporation system (not shown), and aluminum is deposited to 3000 angstroms thick over the entire surface of the resultant structure. The depth of the micro-recesses is much greater than the thickness of the aluminum layer, i.e., 3000 angstroms, and the photo-resist mask is partially uncovered with the aluminum layer.

The resultant structure is dipped into the etchant, i.e., the water solution of sodium hydroxide at 5 percent, and the etchant penetrates through the exposed portions of the dry film of photo-resist. The photo-resist mask is removed from the glass substrate 21*a* together with a part of the aluminum layer thereon, and the data electrodes 21*b* are left on the glass substrate 21*a*.

Thus, the data electrodes 21*b* are patterned from the aluminum layer in a similar way to the transparent electrodes 20*b*/20*c*.

Figure 9A:
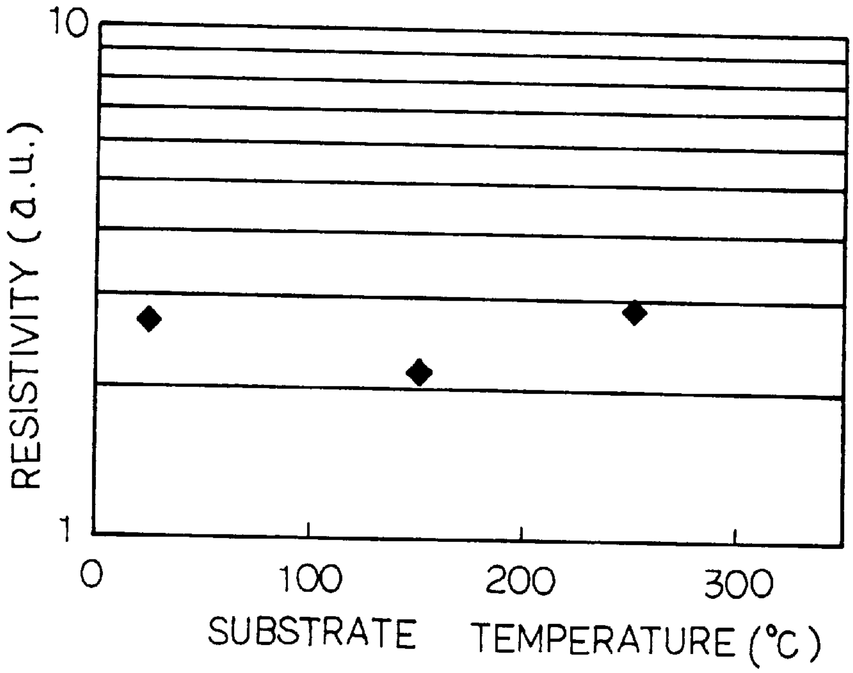

The present inventor evaluated the transparent conductive material deposited through the sputtering using the composite target 34*b*. The transparent conductive material was antimony doped tin oxide or SnO2:Sb. The transparent conductive material had been used for the transparent electrodes of a plasma display panel. However, the transparent conductive material was deposited through a chemical vapor deposition. The present inventor deposited the transparent conductive material at different substrate temperature, and measured the resistivity. The relation between the substrate temperature and the resistivity was plotted in FIG. 9A.

The present inventor further deposited indium tin oxide by using a sputtering at different substrate temperature, and measured the resistivity of the indium tin oxide layers. The relation between the substrate temperature and the resistivity was plotted in FIG. 9B. Comparing FIG. 9A with FIG. 9B, it was understood that the transparent conductive material was less sensitive to the substrate temperature.

The present inventor measured the transmittance of the transparent conductive material deposited by using the composite target 34*b*, and confirmed that the transparency was high enough to be used as the transparent electrodes 20*b*. Thus, the transparent conductive material is deposited through the sputtering under low substrate temperature without deterioration of the transparency and the resistivity. The sputtering at the low substrate temperature does not deteriorate the photo-resist mask, nor is destroyed. For this reason, the transparent electrodes 20*b*/20*c* are repeated on the predetermined pattern.

As will be appreciated from the foregoing description, the photo-resist mask partially uncovered with the conductive material allows the photo-resist remover to penetrate thereinto, and the lift-off is completed within short time. For this reason, the process according to the present invention reduces the production cost.

Although particular embodiments of the present invention have been shown and described, it will be obvious to those skilled in the art that various changes and modifications may be made without departing from the spirit and scope of the present invention.

For example, the plasma processing system 32 may be combined with the sputtering system 34 so as to successively carry out the surface roughening and the sputtering. Moreover, the photo-resist mask may be roughened through an ion milling using argon gas.

The photo-resist mask may be formed from a layer of photo-resist solution spread over the glass substrate.

The data electrodes may be formed of other conductive material such as, for example, copper or chromium.

The present invention is applicable to any kind of plasma display panel, and the ac-current driven plasma display panel may be of an opposite discharging type.

What is claimed is:

1. A process of patterning a conductive layer into an electrode, comprising the steps of:

a) preparing a substrate having a major surface;

b) forming a mask on an area of said major surface of said substrate;

c) roughening a surface of said mask;

d) depositing a conductive layer on said surface of said mask and a remaining area of said major surface of said substrate leaving a non-conformal conductive layer over said mask to expose portions of said mask; and e) removing said mask via said exposed portions thereby removing said conductive layer deposited on the surface of said mask from said substrate leasing said electrode on said remaining area of said major surface of said substrate.

2. The process as set forth in claim 1, in which said surface of said mask is exposed to plasma for forming micro-recesses in a surface portion of said mask.

3. The process as set forth in claim 2, in which said plasma is produced from oxygen gas.

4. The process as set forth in claim 2, in which said micro-recesses have a depth greater than a thickness of said conductive layer.

5. The process as set forth in claim 4, in which said depth is at least five times greater than said thickness.

6. The process as set forth in claim 1, in which said conductive layer is formed of compound containing $SnO_2$ and $Sb_2O_3$.

7. The process as set forth in claim 1 wherein the step of removing said mask further comprises the step of wet etching the substrate, wherein the wet etchant penetrates into said mask through said exposed portions removing said mask and said part of the conductive layer on said mask.

8. A process of patterning a conductive layer into an electrode, comprising the steps of:

a) preparing a substrate having a major surface;

b) forming a mask on an area of said major surface of said substrate;

c) roughening a surface of said mask;

d) depositing a conductive layer on said surface of said mask and a remaining area of said major surface of said substrate leaving a non-conformal conductive layer over said mask to expose portions of said mask; and e) applying an etchant to said mask through said exposed portions to facilitate removal of said conductive layer deposited on the surface of said mask from said substrate thereby leaving said electrode on said remaining area of said major surface of said substrate.

9. A process of patterning a conductive layer into an electrode, comprising the steps of:

a) preparing a substrate having a corresponding surface area;

b) forming a mask on a portion of said surface area of said substrate;

c) creating a roughened surface on said mask having a first depth;

d) depositing a conductive material in a substantially uniform manner over said surface area, including said mask, to a second depth, thereby forming a conductive layer, wherein said first depth is greater than said second depth to form a non-conformal conductive layer over said mask to expose portions of said mask; and e) applying an etchant to said mask to remove said mask and said conductive layer on said mask, thereby leaving a remaining conductive layer to form said electrode on said substrate.

10. A process of patterning a conductive layer into an electrode, comprising the steps of:

a) preparing a substrate having a major surface;

b) forming a mask on an area of said major surface of said substrate;

c) roughening a surface of said mask;

d) depositing a conductive layer on said roughened surface of said mask and a remaining area of said major surface leaving a non-conformal conductive layer over said mask to expose portions of said mask; and e) applying an etchant to said mask through the uncovered portions of said roughened surface to remove said mask and the portion of the conductive layer thereon, the remaining area conductive layer forming said electrode.

11. The process as set forth in claim 9, wherein the roughened surface comprises microrecesses.

* * * * *